(12) United States Patent
Reiter et al.

(10) Patent No.: US 11,935,875 B2
(45) Date of Patent: Mar. 19, 2024

(54) POWER MODULE LAYOUT FOR SYMMETRIC SWITCHING AND TEMPERATURE SENSING

(71) Applicant: Infineon Technologies AG, Neubiberg (DE)

(72) Inventors: Tomas Manuel Reiter, Munich (DE); Waldemar Jakobi, Soest (DE); Michael Niendorf, Verl (DE)

(73) Assignee: Infineon Technologies AG, Neubiberg (DE)

( * ) Notice: Subject to any disclaimer, the term of this patent is extended or adjusted under 35 U.S.C. 154(b) by 122 days.

(21) Appl. No.: 17/537,678

(22) Filed: Nov. 30, 2021

(65) Prior Publication Data
US 2023/0170333 A1    Jun. 1, 2023

(51) Int. Cl.
*H01L 23/498* (2006.01)
*H01L 23/00* (2006.01)
*H01L 25/07* (2006.01)

(52) U.S. Cl.
CPC ...... *H01L 25/072* (2013.01); *H01L 23/49811* (2013.01); *H01L 24/48* (2013.01); *H01L 2224/48137* (2013.01); *H01L 2224/48227* (2013.01); *H01L 2924/13055* (2013.01); *H01L 2924/13091* (2013.01)

(58) Field of Classification Search
CPC .................. H01L 25/072; H01L 23/49811
See application file for complete search history.

(56) References Cited

U.S. PATENT DOCUMENTS

2019/0140598 A1*  5/2019  Schultz ............... H04B 1/0458

FOREIGN PATENT DOCUMENTS

CN         104134652 B  *  4/2019  ......... H01L 23/3735

* cited by examiner

*Primary Examiner* — Michele Fan
(74) *Attorney, Agent, or Firm* — Murphy, Bilak & Homiller, PLLC

(57) ABSTRACT

A power semiconductor module arrangement includes a power electronics substrate comprising a first DC voltage pad, a second DC voltage pad, a first load pad, and a second load pad, first and second transistor dies mounted on the first load pad, third and fourth transistor dies mounted the first DC voltage pad, the first and second transistor dies collectively form a first switch, the third and fourth transistor dies collectively form a second switch, the first and second DC voltage pads are arranged such that a DC supply impedance for a first commutation loop that flows through the first and third transistor dies matches a DC supply impedance for a second commutation loop that flows through the second and fourth transistor dies, and an impedance of a first load connection to the third transistor die is greater than an impedance of a second load connection to the fourth transistor die.

20 Claims, 2 Drawing Sheets

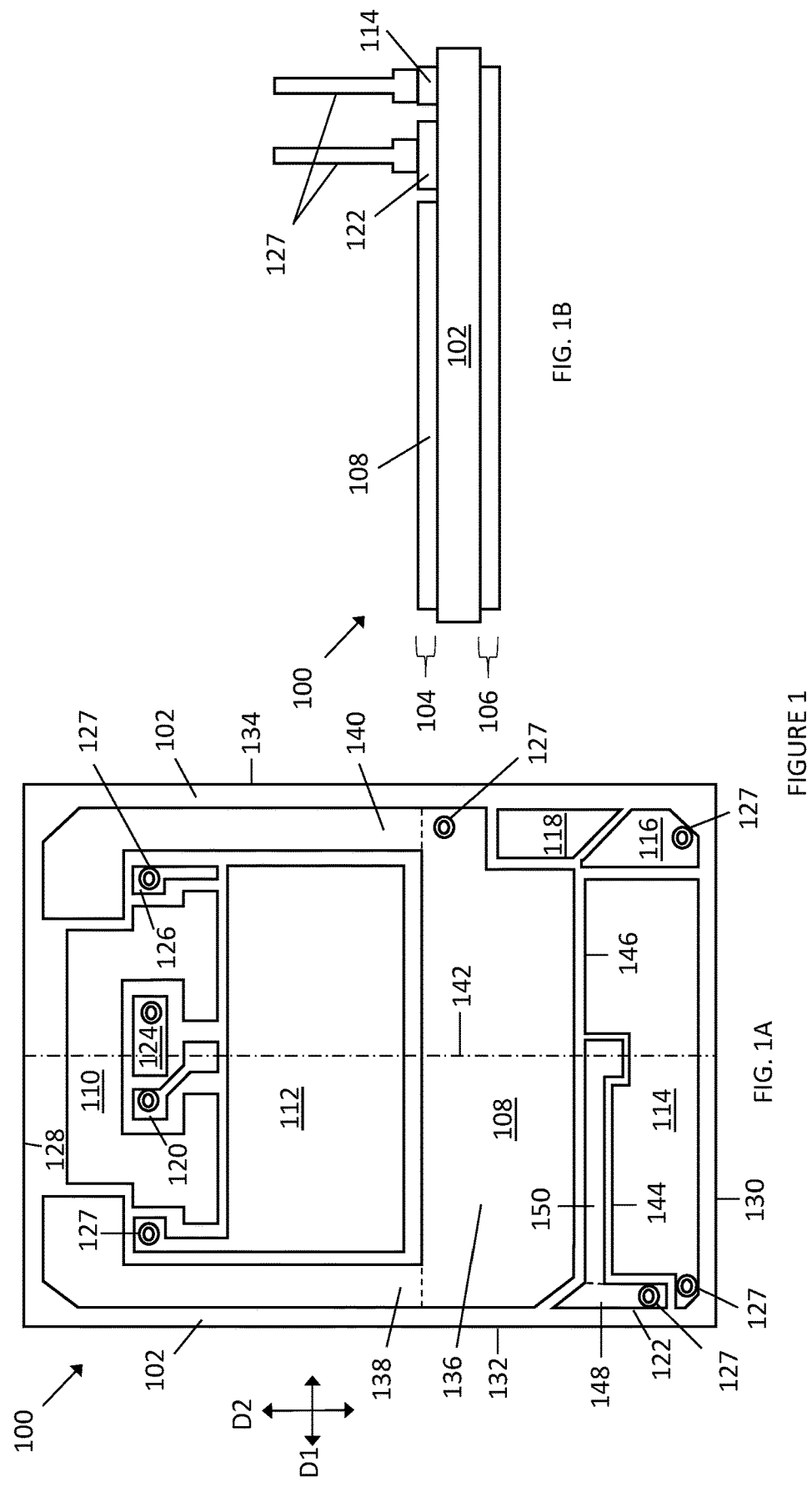

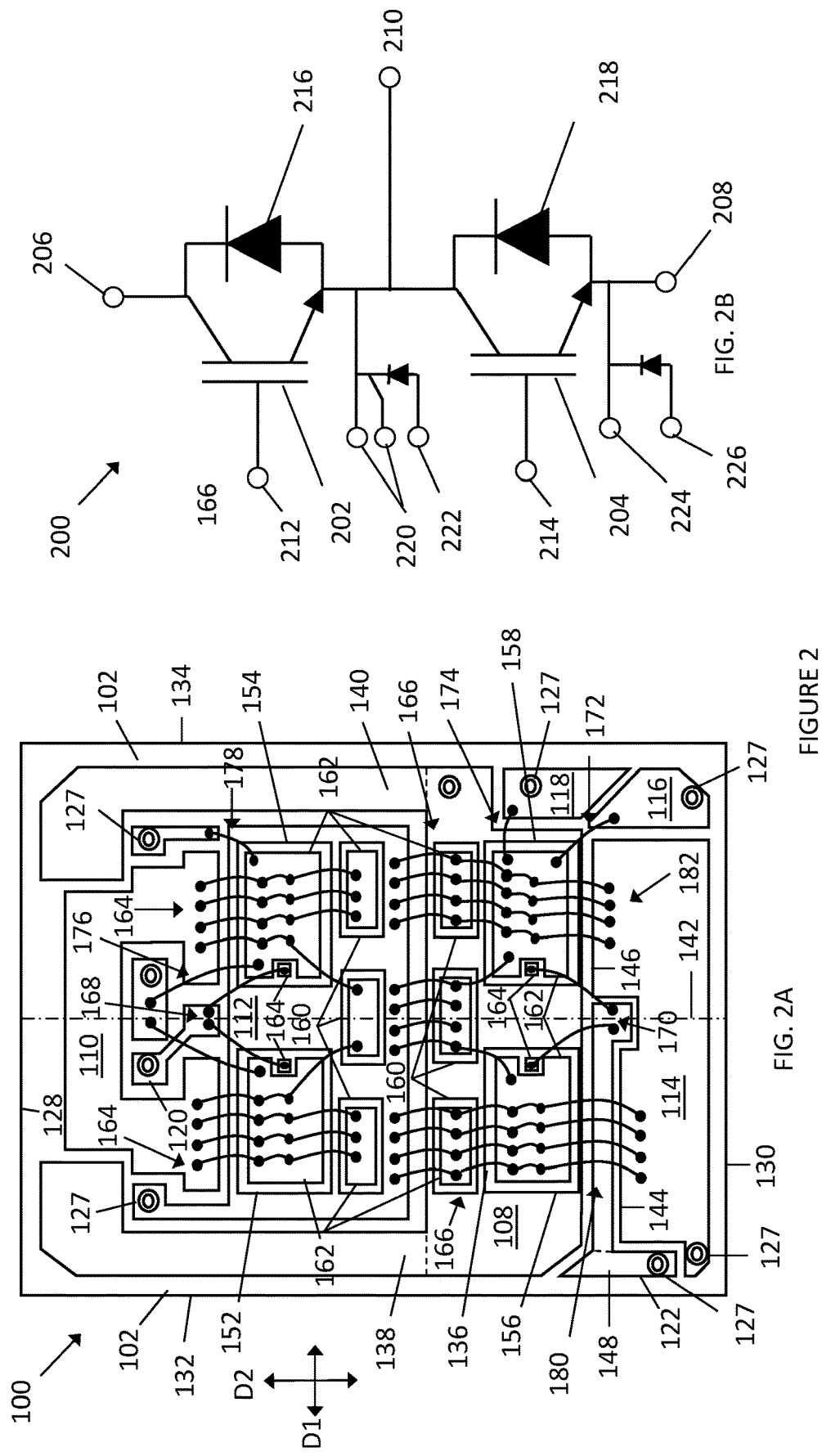

US 11,935,875 B2

POWER MODULE LAYOUT FOR SYMMETRIC SWITCHING AND TEMPERATURE SENSING

BACKGROUND

Many applications such as automotive and industrial applications utilize power modules to accommodate and protect power devices and allow for a power circuit to be mated with an external apparatus, such as a PCB (printed circuit board). Power modules can form part of power efficient solutions to reduce or prevent anthropogenic emissions of greenhouse gases (GHG). For instance, power modules can be used in hybrid electric or purely electric vehicles to switch large amounts of current and/or voltage. More generally, modern power efficient power modules can be incorporated into any electrical setting to improve efficiency and reduce environmental impact.

The circuits housed by power modules include power converter circuits such as single and multi-phase half-wave rectifiers, single and multi-phase full-wave rectifiers, voltage regulators, etc. Power devices such as IGBTs (insulated gate bipolar transistors), power MOSFETs (metal oxide semiconductor field effect transistors), power diodes, etc. form the basic building blocks of these power converter circuits. In some cases, multiple transistor dies may be used to form one topological switch of a power converter circuit. In these circuits, efficient operation is obtained by symmetric switching of the transistor dies which form each topological switch. Moreover, power modules may include sense connections for monitoring an operational state of the individual chips, e.g., temperature, current, etc. Innovative solutions are needed for power modules with symmetric switching of the individual chips and sense connections for monitoring an operational state of some of the individual chips.

SUMMARY

Those skilled in the art will recognize additional features and advantages upon reading the following detailed description, and upon viewing the accompanying drawings.

A power semiconductor module arrangement is disclosed. According to an embodiment, the power semiconductor module comprises a power electronics substrate comprising a dielectric layer, and a first metallization layer disposed on an upper surface of the dielectric layer, the first metallization layer being structured to comprise a first DC voltage pad, a second DC voltage pad, a first load pad, and a second load pad, first and second transistor dies mounted on the first load pad, third and fourth transistor dies mounted the first DC voltage pad, wherein the first and second transistor dies collectively form a first switch that is connected between the second DC voltage pad and the first load pad, wherein the third and fourth transistor dies collectively form a second switch that is connected between the first DC voltage pad and the second load pad, wherein the first and second DC voltage pads are arranged such that a DC supply impedance for a first commutation loop that flows through the first and third transistor dies matches a DC supply impedance for a second commutation loop that flows through the second and fourth transistor dies, wherein the third transistor die is connected to the second load pad by a first load connection, wherein the fourth transistor die is connected to the second load pad by a second load connection, and wherein an impedance of the first load connection is greater than an impedance of the second load connection.

Separately or in combination, the first metallization is structured to comprise a first sense pad, wherein the power semiconductor module further comprises a sense connection between the first sense pad and the fourth transistor die.

Separately or in combination, the first load connection comprises one or more interconnect elements connected between an upper surface terminal of the third transistor die and the second load pad, wherein the second load connection comprises one or more interconnect elements connected between an upper surface terminal of the fourth transistor die and the second load pad, and wherein the greater impedance of the first load connection than the second load connection comprises a physical difference between the one or more interconnect elements from the first load connection and the one or more interconnect elements from the second load connection.

Separately or in combination, the physical difference comprises any one or more of: a difference in length of the interconnect elements, a difference in number of the interconnect elements, a difference in material composition of the interconnect elements; and a difference in cross-sectional area of the interconnect elements.

Separately or in combination, the first DC voltage pad has a u-shaped geometry, wherein an open ended side of the u-shaped first DC voltage pad faces the first load pad and the second DC voltage pad, and wherein a closed side of the of the u-shaped first DC voltage pad faces the second load pad and the first sense pad.

Separately or in combination, the first metallization is structured to comprise a second switch gate pad, wherein the power semiconductor module further comprises a gate connection between the second switch gate pad and gate terminals of the third and fourth transistor dies.

Separately or in combination, the first metallization is structured to comprise a second switch gate pad, wherein the power semiconductor module further comprises a gate connection between the second switch gate pad and gate terminals of the third and fourth transistor dies, and wherein the second switch gate pad comprises a runner that is arranged between the first DC voltage pad and a portion of the second load pad.

Separately or in combination, the second load pad comprises an inner edge side that faces the first DC voltage pad, wherein the runner is arranged between a first span of the inner edge side of the second load pad and the first DC voltage pad, wherein a second span of the inner edge side of the second load pad is arranged immediately across from the first DC voltage pad, wherein the interconnect elements from the first load connection extend over the runner and the first span, and wherein the interconnect elements from the first load connection extend over the second span.

Separately or in combination, the interconnect elements from the first load connection comprise a first plurality of bond wires, wherein the interconnect elements from the second load connection comprise a second plurality of bond wires, and wherein a total length of the bond wires from the first plurality is greater than a total length of the bond wires from the second plurality.

Separately or in combination, the second switch gate pad comprises an outer pad section, wherein the outer pad section is arranged between the second load pad and a third edge side of the power electronics substrate, and wherein the first sense pad is arranged between the second load pad and a fourth edge side of the power electronics substrate, the fourth edge side being opposite the third edge side.

Separately or in combination, the first metallization is structured to comprise a second sense pad, wherein the power semiconductor module further comprises a second sense connection between the second sense pad and the fourth transistor die, and wherein the second sense pad is arranged between the first DC voltage pad and the fourth edge side of the power electronics substrate.

Separately or in combination, the power semiconductor module arrangement comprises a half-bridge circuit, wherein the first switch is a low-side switch of the half-bridge circuit, and wherein the second switch is a high-side switch of the half-bridge circuit.

According to another embodiment, the power semiconductor module arrangement comprises a power electronics substrate comprising a dielectric layer, and a first metallization layer disposed on an upper surface of the dielectric layer, the first metallization layer being structured to comprise a first DC voltage pad, a second DC voltage pad, a first load pad, and a second load pad, wherein the first DC voltage pad comprises a central section, a first outer span, and a second outer span, the first and second outer spans each extending from opposite ends of the central section towards a first edge side of the power electronics substrate, wherein the second DC voltage pad and the first load pad are arranged between the first and second outer spans in a first direction, wherein the second DC voltage pad and the first load pad are arranged between the central section and a first edge side of the power electronics substrate in a second direction that is perpendicular to the first direction, and wherein the second load pad is arranged between the DC voltage pad and a second edge side of the power electronics substrate in the second direction, the second edge side being opposite from the first side, wherein the first and second outer spans of the first DC voltage pad are symmetric relative to an axis of symmetry that extends in the in the second direction, and wherein a geometry of the second load pad is asymmetric relative to the axis of symmetry.

Separately or in combination, the second load pad comprises an inner edge side that faces the central section of the first DC voltage pad, wherein the inner edge side comprises first and second spans that are disposed on opposite sides of the axis of symmetry, and wherein the first span is spaced further apart from the first DC voltage pad than the second span.

Separately or in combination, the first metallization is structured to comprise a first sense pad, and wherein the first sense pad is disposed on the same side of the axis of symmetry as the second span.

Separately or in combination, the first metallization is structured to comprise a second switch gate pad, wherein the second switch gate pad is disposed on the same side of the axis of symmetry as the first span.

Separately or in combination, the second switch gate pad comprises a runner that is arranged between the first span and the first DC voltage pad, and wherein the second span is arranged immediately across from the first DC voltage pad.

Separately or in combination, the power electronics substrate comprises third and fourth edge sides that are opposite from one another and each extend between the first and second edge sides of the power electronics substrate, wherein an outer edge of the second switch gate pad faces the third edge side, and wherein an outer edge of the first sense pad faces the fourth edge side.

Separately or in combination, the first metallization is structured to comprise a second sense pad, wherein the second sense pad is disposed on the same side of the axis of symmetry as the second span.

Separately or in combination, the power semiconductor module arrangement further comprises third and fourth transistor dies mounted on the central section of the first DC voltage pad, wherein the third transistor die is connected to the second load pad by a first load connection, wherein the fourth transistor die is connected to the second load pad by a second load connection, wherein the third transistor die and the first load connection are disposed on an opposite side of the axis of symmetry as the fourth transistor die and the second load connection.

Separately or in combination, an impedance of the first load connection is greater than an impedance of the second load connection.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A and 1B, illustrates a power electronics substrate, according to an embodiment. FIG. 1A illustrates a plan-view perspective of the power electronics substrate, and FIG. 1B illustrates a side-view perspective of the power electronics substrate.

FIG. 2, which includes FIGS. 2A and 2B, illustrates a power semiconductor module arrangement that comprises a plurality of semiconductor dies mounted on a power electronics substrate, according to an embodiment. FIG. 2A illustrates a plan-view perspective of the power semiconductor module arrangement, and FIG. 2B illustrates an equivalent circuit schematic of the power semiconductor module arrangement, according to an embodiment.

DETAILED DESCRIPTION

Embodiments of a power semiconductor module arrangement with an advantageous layout are disclosed herein. The power semiconductor module comprises a power electronics substrate with DC voltage pads that are advantageously symmetric with respect to an axis of symmetry that runs through a center of power electronics substrate. In particular, a first DC voltage pad has a u-shaped geometry and the open side of the u-shaped first DC voltage pad faces a second DC voltage pad, with both of these pads being symmetric with respect to the axis of symmetry. This symmetrical layout forms symmetric commutation loops for semiconductor dies mounted on either side of the axis of symmetry. As a result, the power semiconductor module can have a multi-device arrangement with multiple semiconductor dies mounted on either side of the axis of symmetry forming a single topological switch and having a matched DC supply impedance. Meanwhile, the layout of the power semiconductor module advantageously yields an asymmetry in the impedance of the load connection such that, as between two semiconductor dies which form a single topological switch, one of the semiconductor dies is presented with a slightly higher load impedance. This guarantees that one of the semiconductor die will operate at a slightly higher temperature. As a result, sense connections are only necessary on one side of the power semiconductor module arrangement, and the number of I/O connections to the power semiconductor module arrangement are advantageously reduced.

Referring to FIG. 1, a power electronics substrate 100 is depicted, according to an embodiment. The power electronics substrate 100 is a circuit carrier that is designed to accommodate the mounting of multiple power semiconductor devices thereon and to efficiently extract heat away from these power semiconductor devices during operation. The power electronics substrate may comprise layers of conductive and electrically insulating material. For example, the power electronics substrate 100 may be a DBC (direct bonded copper) substrate, an AMB (active metal brazed) substrate, an IMS (insulated metal substrate) or a PCB (printed circuit board). The power electronics substrate 100 may be arranged in a plastic housing that protects the various elements mounted on the power electronics substrate 100. For example, the power electronics substrate 100 may be included in a power module that comprises multiple ones of the power electronics substrates 100, with each of the power electronics substrates 100 accommodating a power converter circuit.

The power electronics substrate 100 comprises a dielectric layer 102. Generally speaking, the dielectric layer 102 can include any of a wide variety of electrically insulating materials used in electronics applications such as ceramics, plastics, laminates, etc. More particularly, the dielectric layer 102 may include a ceramic material such as $Al_2O_3$ (Alumina) AlN (Aluminium Nitride), etc., e.g., in the case of a DBC, AMB or IMS substrate, and may include pre-peg materials (pre impregnated fibre) such as FR-2, FR-4, CEM-1, G-10, etc., e.g., in the case of a PCB.

The power electronics substrate 100 comprises a first metallization layer 104 disposed on an upper surface of the dielectric layer 102. The first metallization layer 104 is structured to comprise a plurality of isolated pad regions, the details of which will be described in further detail below. The power semiconductor module may further comprise a second metallization layer 106 disposed on a lower surface of the dielectric layer 102. The second metallization layer 106 may be a continuous layer that is used to mate the power electronics substrate 100 with a cooling apparatus, such as a heat sink. Generally speaking, the first and second metallization layers 104, 106 may comprise or be plated with any or more of Cu, Ni, Ag, Au, Pd, Pt, NiV, NiP, NiNiP, NiP/Pd, Ni/Au, NiP/Pd/Au, or NiP/Pd/AuAg. In an embodiment, the first metallization layer 104 comprises regions of Cu or Cu alloy with an Ni based coating formed on the outer surfaces of the Cu or Cu alloy.

The first metallization layer 104 is structured to comprise a first DC voltage pad 108, a second DC voltage pad 110, a first load pad 112, a second load pad 114, a first sense pad 116, a second sense pad 118, a first switch gate pad 120, a second switch gate pad 122, a third sense pad 124, and a fourth sense pad 126. Each of these pads are separated from one another by gaps in the first metallization, thus forming electrically isolated regions of metallization on the power electronics substrate 100.

The power semiconductor module arrangement may comprise press-fit connectors 127. The press-fit connectors 127 are electrically conductive structures that may be formed from a electrically conductive metal e.g., Cu, Al, etc. and are configured to be inserted into an opening of a receptacle, e.g., a PCB, in a form-fitting manner. The press-fit connectors 127 can comprise a base section that is attached, e.g., by solder, to the first metallization layer 104 and an elongated protraction that extends away from the base section, for example. In the case that the power electronics substrate 100 is arranged within a plastic housing, the press-fit connectors 127 allow for external electrical connection to each of the first DC voltage pad 108, the second DC voltage pad 110, the first load pad 112, the second load pad 114, the first sense pad 116, the second sense pad 118, the first switch gate pad 120, the second switch gate pad 122, the third sense pad 124, and the fourth sense pad 126.

The arrangement of the various pads will be described with reference to a first lateral direction D1 and a second lateral direction D2. The first lateral direction D1 is perpendicular to the second lateral direction D2. The power electronics substrate 100 comprises first and second edge sides 128, 130 that are opposite from one another and third and fourth edge sides 132, 134 that are opposite from one another and each extend between the first and second edge sides 128, 130. The first and second edge sides 128, 130 are spaced apart from one another in the second lateral direction D2. The third and fourth edge sides 132, 134 are spaced apart from one another in the first lateral direction D1. Generally speaking, the outer geometry of the power electronics substrate 100 may be adapted to conform to the geometry of a particular power module, and is not necessarily exactly rectangular as shown.

The first DC voltage pad 108 comprises a central section 136, a first outer span 138, and a second outer span 140. The first and second outer spans 138, 140 adjoin the central section 136 at opposite ends of the central section 136 and each extend from the central section 136 towards the first edge side 128 in the second lateral direction D2. As can be seen, this arrangement results in the first DC voltage pad 108 having a U-shaped geometry, with a central area partially enclosed by the U-shaped first DC voltage pad 108 and an open ended side of the U-shaped first DC voltage pad 108 facing the first edge side 128. As used herein, a U-shaped geometry refers to any geometry comprising two elongated outer spans that extend away from a central span with an inner edge side that is transverse to the two elongated outer spans. As shown, the first and second outer spans 138, 140 comprise linear edge sides that are perpendicular to the edge side of the central section 136 and form acute corners with the inner edge side of the central span. A U-shaped geometry also encompasses configurations comprising curved transitions and/or elongated outer spans that are not exactly perpendicular to the central span.

The second DC voltage pad 110 and the first load pad 112 are arranged between the first and second outer spans 138, 140 in the first lateral direction D1 and are arranged between the central section 136 and the first edge side 128 in the second direction D2. The second load pad 114, the sense pad 116, the second sense pad 118 are each arranged between the first DC voltage pad 108 and the second edge side 130 of the power electronics substrate 100 in the second direction D2.

According to an embodiment, the first and second outer spans 138, 140 of the first DC voltage pad 108 are symmetric with respect to an axis of symmetry 142 that extends in the second direction D2 and bisects the power electronics substrate 100. Stated another way, the first DC voltage pad 108 is symmetric with respect to the axis of symmetry 142 beginning at the intersection between the first and second outer spans 138, 140 and the central section 136 and ending at the outer ends of the first and second outer spans 138, 140 that face the first edge side 128 of the of the power electronics substrate 100. Moreover, according to an embodiment, the second DC voltage pad 110 is symmetric with respect to the axis of symmetry 142.

Meanwhile, as can be seen, the structuring of the first metallization layer 104 in a region between the first DC voltage pad 108 and the second edge side 130 is asymmetric relative to the axis of symmetry 142. In particular, the second load pad 114 has an asymmetric geometry relative to the axis of symmetry 142. The second load pad 114 comprises an inner edge side that faces the central span 108 of the first DC voltage pad 108. The inner edge side of the second load pad 114 comprises first and second spans 144, 146 that are disposed on opposite sides of the axis of symmetry 142. The first span 144 of the inner edge side is spaced further apart in the second lateral direction D2 from the first DC voltage pad 108 than the second span 146. Furthermore, the second switch gate pad 122, the first sense pad 116 and the second sense pad 118 represent another asymmetry with respect to the axis of symmetry 142. As can be seen, the second switch gate pad 122 is mostly disposed on the same side of the axis of symmetry 142 as the first span 144, and is disposed closer to the third edge side 132 than the fourth edge side 134. Meanwhile, the first and second sense pads 116, 118 are disposed closer the fourth edge side 134 than the third edge side 132 and are each on the same side of the axis of symmetry 142 as the second span 146.

The second switch gate pad 122 comprises an outer pad section 148 and a runner 150. The outer pad section 148 is arranged between the second load pad 114 and the third edge side 132 in the first lateral direction D1, and comprises an outer edge side that faces the third edge side 132. The runner 150 extends from the outer pad section 148 towards the fourth edge side 134 in the first lateral direction 1. The runner 150 is arranged between the first span 144 of the second load pad 114 and the first DC voltage pad 108. Meanwhile, the second span 146 of the second load pad 114 is arranged immediately across from the first DC voltage pad 108, meaning that no other regions of the first metallization region 104 are interposed between the second span 146 and the second load pad 114. Thus, the asymmetric geometry of the second load pad 114 accommodates the runner 150 of the second switch gate pad 122 on one side of the axis of symmetry 142 while bringing the second load pad 114 as close as possible to the first DC voltage pad 108 on the opposite side of the axis of symmetry 142.

Referring to FIG. 2, a power semiconductor module arrangement comprising a multi-chip power conversion circuit 200 mounted on the power electronics substrate 100 is shown. FIG. 2A illustrates a physical layout of the semiconductor dies and associated electrical connections (with some elements being omitted for simplicity) on the power electronics substrate 100. FIG. 2B depicts an equivalent circuit schematic of the multi-chip power conversion circuit 200 realized by the mounting and interconnection of the elements on the power electronics substrate 100.

Referring to FIG. 2A, the power semiconductor module arrangement comprises first and second transistor dies 152, 154 mounted on the first load pad 112, and comprises third and fourth transistor dies 156, 158 mounted on the first DC voltage pad 108. The first, second, third and fourth transistor dies 152, 154, 156, 158 can each be configured as discrete transistor dies, for example MOSFETs (Metal Oxide Semiconductor Field Effect Transistors), IGBTs (Insulated Gate Bipolar Transistors), and HEMTs (High Electron Mobility Transistors), etc. Each die may comprise one or more transistor cell. The power semiconductor module arrangement additionally comprises three diode dies 160 mounted on the first load pad 112 and three diode dies 160 mounted on the first DC voltage pad 108.

Generally speaking, the first, second, third and fourth transistor dies 152, 154, 156, 158 and the diode dies 160 can be formed in a wide variety of device technologies and include a wide variety of semiconductor materials. Examples of such materials include, but are not limited to, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), etc.

According to an embodiment, the first, second, third and fourth transistor dies 152, 154, 156, 158 and the diode dies 160 are configured as discrete power devices that are rated to accommodate voltages of at least 100 V (volts), e.g., voltages of 600 V, 1200 V or more and/or are rated to accommodate currents of at least 1A, e.g., currents of 10A, 50A, 100A or more. The first, second, third and fourth transistor dies 152, 154, 156, 158 and the diode dies 160 may be configured vertical devices, which refers to a device that conducts a load current between opposite facing main and rear surfaces of the die. To this end, each of the first, second, third and fourth transistor dies 152, 154, 156, 158 and the diode dies 160 comprise a first load terminal 162 disposed on an upper surface of the respective die that faces away from the power electronics substrate 100 and a second load terminal (not shown) disposed on a rear surface of the respective die that faces the power electronics substrate 100. The first load terminal 162 and the second load terminal refer to the voltage blocking terminals of the device, e.g., the source and drain in the case of a MOSFET, collector and emitter in the case of an IGBT, anode and cathode in the case of a diode, and so forth. Each of the first, second, third and fourth transistor dies 152, 154, 156, 158 further comprise a gate terminal 164 disposed on the upper surface of the respective die. In a commonly known manner, the gate terminal 164 is configured to control a conductive connection between the load terminals of each transistor die.

The first load terminals 162 of the first and second transistor dies 152, 154 and the diode dies 160 on the first load pad 112 are electrically connected to the first DC voltage pad 108 by first DC voltage connection 164. The second load terminals of the first and second transistor dies 152, 154 and the second load terminals of the diode dies 160 on the first load pad 112 face the first load pad 112 and form an electrical connection thereto by a conductive adhesive, e.g., solder, sinter, conductive glue, etc. The first load terminals 162 of the third and fourth transistor dies 156, 158 and the diode dies 160 on the first DC voltage pad 108 are electrically connected to the first load pad 112 and to the second load pad 112 by a load connection 166. The second load terminals 162 of the third and fourth transistor dies 156, 158 and the second load terminals of the diode dies 160 on the first DC voltage pad 108 face the first DC voltage pad 108 and form an electrical connection thereto by a conductive adhesive, e.g., solder, sinter, conductive glue, etc. The gate terminals 164 of the first and second transistor dies 152, 154 are electrically connected to the first switch gate pad 120 by a first gate connection 168. The gate terminals 164 of the third and fourth transistor dies 156, 158 are electrically connected to the second switch gate pad 122 by a second gate connection 170. The first load terminal 162 of the fourth transistor die 158 is electrically connected to the first sense pad 116 by a first sense connection 172 and is electrically connected to the second sense pad 118 by a second sense connection 174. The first load terminals 162 of the first and second transistor dies 152, 154 are electrically connected to the third sense pad 124 by a third sense connection 176, and the first load terminal 162 of the first transistor die 152 is electrically connected to the fourth sense pad 126 by a fourth sense connection 178.

Each of the first DC voltage connection 164, the load connection 166, the first gate connection 168, the second gate connection 170, the first sense connection 172, the second sense connection 174, the third sense connection 176 and the fourth sense connection 178 comprise one or more interconnect elements. These interconnect elements are connected between the terminals of two semiconductor dies and/or between the terminal of a semiconductor die and the pad regions of the first metallization layer 104, as the case may be. In the depicted embodiment, each of the interconnect elements are bond wires. More generally, these interconnect elements can be any type of conductive interconnect element used to effectuate an electrical connection, including different types of bond wires, metal clips, interconnect ribbons, etc. Moreover, the number and arrangement of the interconnect element in the depicted embodiment is for illustration purposes only. Different numbers and arrangements of interconnect elements may be used, while meeting design goal, such as the symmetric commutation loops and asymmetric load impedance to be discussed in further detail below.

According to an embodiment, the first and second transistor dies 152, 154 collectively form a first switch that is connected between the second DC voltage pad 110 and the first load pad 112. That is, the first and second transistor dies 152, 154 are configured to operate in unison with one another so as to collectively conduct current and block voltage between the second DC voltage pad 110 and the first load pad 112. The first and second transistor dies 152, 154 may be nominally identical to one another and operated by the common first gate connection 168 so as to effectively operate as a single switching device. Similarly, the third and fourth transistor dies 152, 154 may collectively form a second switch that is connected between the first DC voltage pad 108 and the second load pad 114. Likewise, the diode dies 160 mounted on the first load pad 112 may collectively form a first voltage blocking device that is connected between the second DC voltage pad 110 and the first load pad 112, and the diode dies 160 mounted on the first DC voltage pad 108 may collectively form a second voltage blocking device that is connected between the first DC voltage pad 108 and the second load pad 114. More generally, a single topological element can be realized by connecting together any number, e.g., three, four, five, etc. of discrete semiconductor device dies together so as to operate in unison with one another.

Referring to FIG. 2B, an equivalent circuit schematic of a power conversion circuit 200 this is realized by the power semiconductor module arrangement of FIG. 2A is shown. In the depicted embodiment, the power conversion circuit 200 is configured as a half-bridge circuit. A half-bridge circuit refers to one type of circuit topology that is used in a power conversion circuit, such as a DC to DC converter, DC to AC converter, etc. A half-bridge circuit comprises a high-side switch connected in series with a low-side switch. In this case, the high-side switch is provided by a first IGBT 202 and the low-side switch is provided by a second IGBT 204. The collector terminal of the first IGBT 202 is connected to a positive supply voltage node 206, the emitter terminal of the second IGBT 202 is connected to a negative supply voltage node 208, and the emitter terminal of the first IGBT 202 and the collector terminal of the second IGBT 202 are each connected to the output node 210 of the half-bridge circuit. The gate terminal of the first IGBT 202 is connected to a first control node 212 and the gate terminal of the second IGBT 212 is connected to a second control node 214. The half-bridge circuit performs power conversion by successively switching the high-side switch and the low-side switch via the first and second control nodes 212, 214 according to a power control scheme (e.g., pulse width modulation) to produce a desired voltage and frequency at the output node 210 of the half-bridge circuit. The half-bridge circuit additionally comprises first and second diodes 216, 218 that are arranged in an antiparallel configuration with the high-side switch and the low-side switch, respectively. The first and second diodes 216, 218 are arranged as reverse-conducting diodes so as to permit a freewheeling current in parallel with the high-side and low-side switch, respectively. This depicted circuit topology represents just one type of power conversion circuits, and the concepts described herein are more generally applicable to other types of multi-switch power conversion circuits, including other half-bridge circuit topologies. For example, a similar type of half-bridge circuit may be constructed using MOSFET devices, wherein the source and drain terminals of the transistors replace the emitter and collector terminals, respectively.

The power conversion circuit 200 additionally comprises a number of sense nodes for sensing the operational state (e.g., current, temperature) of the high-side switch and the low-side switch. In particular, the power conversion circuit 200 comprises a first high-side switch sense node 220 and a second high-side switch sense node 222. Moreover, the power conversion circuit 200 comprises a first low-side switch sense node 224 and a second high-side switch sense node 226. The sense nodes can be used to sense a current and/or temperature of the devices to which the are connected to. For instance, the first high-side switch sense node 220 and the first low-side switch sense node 224 can be configured as a kelvin emitter/source terminal, e.g., using a temperature sensitive device, such as a diode, thermistor, etc. The second high-side switch sense node 222 and the second low-side switch sense node 226 can be configured as auxiliary emitter/source terminals for connection to a sensor and monitoring functions.

Referring again to FIG. 2A, the third and fourth transistor dies 156, 158 may collectively correspond to the first IGBT 202, i.e. the high-side switch, the first and second transistor dies 152, 154 may collectively correspond to the second IGBT 204, i.e., the low-side switch, the diode dies 160 mounted on the first DC voltage pad 108 may collectively corresponds to the second diode 218, and the diode dies 160 mounted on the first load pad 112 may collectively corresponds to the first diode 216. The first DC voltage pad 108 may correspond to the positive supply voltage node 206, the second DC voltage pad 110 may correspond to the negative supply voltage node 208, the first and second load pads 112, 114 may correspond to the output node 210, the second switch gate pad 122 may correspond to the first control node 212, the first switch gate pad 120 may correspond to the second control node 214. The first and second high-side switch sense nodes 220, 222 may correspond to the first and second sense pads 116, 118, and the first and second low-side switch sense nodes 224, 226 may correspond to the third and fourth sense pads 124, 126. The diodes shown in FIG. 2B that are connected between the first and second high-side switch sense nodes 220, 222 and between the first and second low-side switch sense nodes 224, 226 can be provided by discrete devices that are mounted on the power electronics substrate 100 (not shown) or can be integrally formed elements of the transistor dies. These diodes may be configured as temperature sensing diodes, for example. Alternatively, these discrete devices may comprise other types of devices such as temperature dependent resistors, NTC (negative temperature coefficient) thermistor, PTC (positive temperature coefficient) thermistor, etc.

According to an embodiment, the first and second DC voltage pads 112, 114 are arranged such that a DC supply impedance for a first commutation loop that flows through the first and third transistor dies 152, 156 matches a DC supply impedance for a second commutation loop that flows through the second and fourth transistor dies 154, 158. The first commutation loop refers to the connections which supply fixed voltages to the power converter circuit 200 on one side of the axis of symmetry 142. The first commutation loop comprises the DC voltage connection between the second DC voltage pad 110 and the first transistor die 152 and comprises the DC voltage connection between the first DC voltage pad 108 and the third transistor die 156. The second commutation loop refers to the connections which supply fixed voltages to the power converter circuit 200 on the opposite side of the axis of symmetry 142 as the first commutation loop. The second commutation loop comprises the DC voltage connection between the second DC voltage pad 110 and the second transistor die 154 and comprises the DC voltage connection between the first DC voltage pad 108 and the fourth transistor die 158. Due to the symmetric geometry of the first DC voltage pad 108 as described above, the third and fourth transistor dies 156, 158 are connected to a first DC voltage (e.g., the potential from the positive supply voltage node 206) by geometrically symmetric metallization regions on either side of the axis of symmetry 142. Similarly, the symmetric geometry of the second DC voltage pad 110 connects the first and second transistor dies 152, 154 to a second DC voltage (e.g., the potential from the negative supply voltage node 208) by geometrically symmetric metallization regions on either side of the axis of symmetry 142. This geometry, in combination with the arrangement of the first, second, third and fourth transistor dies 152, 154, 156, 158 and matching of the interconnect elements, matches the DC supply impedance of the first commutation loop with the DC supply impedance of the second commutation loop. As a result, discrepancies in stray inductance for the commutations loops of the different devices forming one topological switch are minimized, and symmetric operation of the devices, and hence efficient operation, is obtained.

According to an embodiment, the load connection 166 is asymmetric, relative to the the axis of symmetry 142. In particular, the third transistor die 156 is connected to the second load pad 108 by a first load connection 180, the fourth transistor die 158 is connected to the second load pad 108 by a second load connection 182, and the power semiconductor module is configured such that the impedance of the first load connection 180 is greater than the impedance of the second load connection 182. In this context, impedance refers to an electrical impedance, i.e., resistance, capacitance, or inductance. Notwithstanding the above-described advantages flowing from symmetric commutation loops that deliver fixed voltages to the semiconductor dies, it is also advantageous to configure the power semiconductor module to ensure that, as between two semiconductor dies which form one topological switch, one of the two semiconductor dies will operate at a slightly higher temperature. This allows for sensing of only the only the temperature semiconductor die which operates at the higher temperature, which in turn minimizes the number of sense connections. As a result, the number of I/O connections to the module is minimized. By intentionally configuring the power semiconductor module such that the impedance of the first load connection 180 is greater than the impedance of the second load connection 182, this ensures that, as between the third transistor die 156 and the fourth transistor die 158, the temperature of the fourth transistor die 158 will be higher than the temperature of the third transistor die 156 during operation, all else being equal.

Generally speaking, the greater impedance of the first load connection 180 relative to the second load connection 182 can result from any physical difference, e.g., resistance, size, material composition, arrangement, etc., between the interconnect elements which form the first load connection 180 and the interconnect elements which form the second load connection 182. According to an embodiment, this physical difference comprises any one or more of a difference in length of the interconnect elements, a difference in number of the interconnect elements, a difference in material composition of the interconnect elements, and a difference in cross-sectional area of the interconnect elements.

For example, the interconnect elements forming the first load connection 180 can be intentionally made to be longer than the interconnect elements forming the second load connection 182, thus increasing the overall resistance of the first load connection 180 relative to the second load connection 182, all else being equal. In the case that multiple interconnect elements are used to form the load connections, at least one, more than one, or all of the interconnect elements forming the first load connection 180 can be longer than the interconnect elements forming the second load connection 182 so as to create a greater net length of the interconnect elements.

In another example, the number of interconnect elements forming the first load connection 180 can be less than the number of interconnect elements forming the first load connection 180. This increases the overall resistance of the first load connection 180 relative to the second load connection 182, all else being equal.

In another example, the material composition of the interconnect elements forming each of the first and second load connections 180, 182 can be selected so the impedance of the first load connection 180 is greater than that of the second load connection 182. For example, the interconnect elements forming the first load connection 180 can comprise a first conductive metal, such as an alloy of copper, aluminum, etc., and the interconnect elements forming the second load connection 180 can comprise a second conductive metal such as an alloy of copper, aluminum, etc. that is different from the first conductive metal and has a greater electrical resistance than the first conductive metal.

In another example, the cross-sectional area of the interconnect elements forming each of the first and second load connections 180, 182 can be selected so the impedance of the first load connection 180 is greater than that of the second load connection 182. For example, the interconnect elements forming the first load connection 180 can comprise bond wires with a first cross-sectional area, and the interconnect elements forming the second load connection 182 can comprise bond wires with a second cross-sectional area that is greater than the first cross-sectional area, thus lowering overall resistance of the second load connection 182 relative to the first load connection 180, all else being equal. In another example, the interconnect elements forming the second load connection 182 can comprise metal clips with a greater cross-sectional area as bond wires, and the interconnect elements forming the first load connection 180 can comprise only bond wires or fewer metal clips as the first load connection 180.

In the depicted embodiment, the interconnect elements from the first load connection 180 comprise a first plurality of bond wires, the interconnect elements from the second load connection 182 comprise a second plurality of bond wires, and a total length of the bond wires from the first plurality is greater than a total length of the bond wires from the second plurality. More particularly, each of the bond wires which form the first load connection 180 are longer than each of the bond wires which form the second load connection 182. This arrangement naturally results from the asymmetric geometry of the second load pad 114, and in particular the fact that the first span 144 of the second load pad 114 is further apart from the first DC voltage pad 108 than the second span 146 of the second load pad 114. Thus, the asymmetric geometry of the second load pad 114 provides for the connection points of the bond wires from the second plurality to be shorter than the bond wires from the second plurality, thus reducing the electrical resistance.

More generally, an asymmetry at the load connection side of the power semiconductor module can be implemented in a variety of different ways to obtain the greater impedance of the first load connection 180 relative to the second load connection 182. The asymmetry can include an asymmetry in the geometry of the first DC voltage pad 108, the properties of the interconnect elements which form the first load connection 180 relative to the second load connection 182, or both.

The asymmetry at the load connection side of the power semiconductor module results in an advantageous space-efficient design, with minimized signal contacts. In particular, the second switch gate pad 122 is disposed mainly on one side of the axis of symmetry 142, and can accommodate a press-fit connector 127 in the outer pad section 148, which is arranged at a peripheral location between the second load pad 114 and the third edge side 132 of the power electronics substrate 100. Moreover, the second switch gate pad 122 can be brought close to the gate terminals 164 of the third and fourth transistor dies 156, 158 by the gate runner 150, which can advantageously be disposed in a region wherein additional spacing between the second load pad 114 and the first DC voltage pad 108 is preferable, since increasing the length of the interconnect elements in this region is preferable. Meanwhile, the first and second sense pads 116, 118 are the only sense pads on the load connection side of the power semiconductor module, and are advantageously arranged near the terminals of the transistor die 158 to which the first and second sense connections 172, 174 are effectuated, thus minimizing interconnect length and associated parasitic impact. As the second load pad 114 does not require a symmetric geometry, the first and second sense pads 116, 118 can be disposed in a corner region of the power semiconductor module with adequate size and spacing to form desirable press-fit contact points.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A power semiconductor module arrangement comprising:
   a power electronics substrate comprising a dielectric layer, and a first metallization layer disposed on an upper surface of the dielectric layer, the first metallization layer being structured to comprise a first DC voltage pad, a second DC voltage pad, a first load pad, and a second load pad;
   first and second transistor dies mounted on the first load pad;
   third and fourth transistor dies mounted on the first DC voltage pad,
   wherein the first and second transistor dies collectively form a first switch that is connected between the second DC voltage pad and the first load pad,
   wherein the third and fourth transistor dies collectively form a second switch that is connected between the first DC voltage pad and the second load pad,
   wherein the first and second DC voltage pads are arranged such that a DC supply impedance for a first commutation loop that flows through the first and third transistor dies matches a DC supply impedance for a second commutation loop that flows through the second and fourth transistor dies,
   wherein the third transistor die is connected to the second load pad by a first load connection,
   wherein the fourth transistor die is connected to the second load pad by a second load connection, and
   wherein an impedance of the first load connection is greater than an impedance of the second load connection.

2. The power semiconductor module arrangement of claim 1, wherein the first metallization is structured to comprise a first sense pad, wherein the power semiconductor module further comprises a sense connection between the first sense pad and the fourth transistor die.

3. The power semiconductor module arrangement of claim 2, wherein the first load connection comprises one or more interconnect elements connected between an upper surface terminal of the third transistor die and the second load pad, wherein the second load connection comprises one or more interconnect elements connected between an upper surface terminal of the fourth transistor die and the second load pad, and wherein the greater impedance of the first load connection than the second load connection comprises a physical difference between the one or more interconnect elements from the first load connection and the one or more interconnect elements from the second load connection.

4. The power semiconductor module arrangement of claim 3, wherein the physical difference comprises any one or more of:
   a difference in length of the interconnect elements;
   a difference in number of the interconnect elements;
   a difference in material composition of the interconnect elements; and a difference in cross-sectional area of the interconnect elements.

5. The power semiconductor module arrangement of claim 2, wherein the first DC voltage pad has a u-shaped geometry, wherein an open ended side of the u-shaped first DC voltage pad faces the first load pad and the second DC voltage pad, and wherein a closed side of the of the u-shaped first DC voltage pad faces the second load pad and the first sense pad.

6. The power semiconductor module arrangement of claim 5, wherein the first metallization is structured to comprise a second switch gate pad, wherein the power semiconductor module further comprises a gate connection between the second switch gate pad and gate terminals of the third and fourth transistor dies.

7. The power semiconductor module arrangement of claim 5, wherein the first metallization is structured to comprise a second switch gate pad, wherein the power semiconductor module further comprises a gate connection between the second switch gate pad and gate terminals of the third and fourth transistor dies, and wherein the second switch gate pad comprises a runner that is arranged between the first DC voltage pad and a portion of the second load pad.

8. The power semiconductor module arrangement of claim 7, wherein the second load pad comprises an inner edge side that faces the first DC voltage pad, wherein the runner is arranged between a first span of the inner edge side of the second load pad and the first DC voltage pad, wherein a second span of the inner edge side of the second load pad is arranged immediately across from the first DC voltage pad, wherein the interconnect elements from the first load connection extend over the runner and the first span, and wherein the interconnect elements from the first load connection extend over the second span.

9. The power semiconductor module arrangement of claim 8, wherein the interconnect elements from the first load connection comprise a first plurality of bond wires, wherein the interconnect elements from the second load connection comprise a second plurality of bond wires, and wherein a total length of the bond wires from the first plurality is greater than a total length of the bond wires from the second plurality.

10. The power semiconductor module arrangement of claim 7, wherein the second switch gate pad comprises an outer pad section, wherein the outer pad section is arranged between the second load pad and a third edge side of the power electronics substrate, and wherein the first sense pad is arranged between the second load pad and a fourth edge side of the power electronics substrate, the fourth edge side being opposite the third edge side.

11. The power semiconductor module arrangement of claim 10, wherein the first metallization is structured to comprise a second sense pad, wherein the power semiconductor module further comprises a second sense connection between the second sense pad and the fourth transistor die, and wherein the second sense pad is arranged between the first DC voltage pad and the fourth edge side of the power electronics substrate.

12. The power semiconductor module arrangement of claim 1, wherein the power semiconductor module arrangement comprises a half-bridge circuit, wherein the first switch is a low-side switch of the half-bridge circuit, and wherein the second switch is a high-side switch of the half-bridge circuit.

13. A power semiconductor module arrangement comprising:

a power electronics substrate comprising a dielectric layer, and a first metallization layer disposed on an upper surface of the dielectric layer, the first metallization layer being structured to comprise a first DC voltage pad, a second DC voltage pad, a first load pad, and a second load pad;

wherein the first DC voltage pad comprises a central section, a first outer span, and a second outer span, the first and second outer spans each extending from opposite ends of the central section towards a first edge side of the power electronics substrate, wherein the second DC voltage pad and the first load pad are arranged between the first and second outer spans in a first direction, wherein the second DC voltage pad and the first load pad are arranged between the central section and a first edge side of the power electronics substrate in a second direction that is perpendicular to the first direction, wherein the second load pad is arranged between the first DC voltage pad and a second edge side of the power electronics substrate in the second direction, the second edge side being opposite from the first side, wherein the first and second outer spans of the first DC voltage pad are symmetric relative to an axis of symmetry that extends in the in the second direction, and wherein a geometry of the second load pad is asymmetric relative to the axis of symmetry.

14. The power semiconductor module arrangement of claim 13, wherein the second load pad comprises an inner edge side that faces the central section of the first DC voltage pad, wherein the inner edge side comprises first and second spans that are disposed on opposite sides of the axis of symmetry, and wherein the first span is spaced further apart from the first DC voltage pad than the second span.

15. The power semiconductor module arrangement of claim 14, wherein the first metallization is structured to comprise a first sense pad, and wherein the first sense pad is disposed on the same side of the axis of symmetry as the second span.

16. The power semiconductor module arrangement of claim 15, wherein the first metallization is structured to comprise a second switch gate pad, wherein the second switch gate pad is disposed on the same side of the axis of symmetry as the first span.

17. The power semiconductor module arrangement of claim 16, wherein the second switch gate pad comprises a runner that is arranged between the first span and the first DC voltage pad, and wherein the second span is arranged immediately across from the first DC voltage pad.

18. The power semiconductor module arrangement of claim 16, wherein the power electronics substrate comprises third and fourth edge sides that are opposite from one another and each extend between the first and second edge sides of the power electronics substrate, wherein an outer edge of the second switch gate pad faces the third edge side, and wherein an outer edge of the first sense pad faces the fourth edge side.

19. The power semiconductor module arrangement of claim 13, further comprising third and fourth transistor dies mounted on the central section of the first DC voltage pad, wherein the third transistor die is connected to the second load pad by a first load connection, wherein the fourth transistor die is connected to the second load pad by a second load connection, wherein the third transistor die and the first load connection are disposed on an opposite side of the axis of symmetry as the fourth transistor die and the second load connection.

20. The power semiconductor module arrangement of claim 19, wherein an impedance of the first load connection is greater than an impedance of the second load connection.

\* \* \* \* \*